US006806750B1

United States Patent
Rasmussen et al.

(10) Patent No.: US 6,806,750 B1
(45) Date of Patent: Oct. 19, 2004

(54) METHOD AND SYSTEM FOR CLOCK DESKEWING USING A CONTINUOUSLY CALIBRATED DELAY ELEMENT IN A PHASE-LOCKED LOOP

(75) Inventors: Richard Robert Rasmussen, Fremont, CA (US); Benjamin Clyde Buchanan, Duluth, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/133,707

(22) Filed: Apr. 26, 2002

Related U.S. Application Data

(63) Continuation of application No. 10/128,044, filed on Apr. 23, 2002, now abandoned.

(51) Int. Cl.[7] .............................................. H03L 7/06
(52) U.S. Cl. ..................... 327/156; 327/159; 327/161
(58) Field of Search ................................ 327/156, 158, 327/159, 161, 270, 271; 331/14, 17, 25, 34

(56) References Cited

U.S. PATENT DOCUMENTS

| | | | | | |
|---|---|---|---|---|---|
| 4,611,230 | A | * | 9/1986 | Nienaber | 348/511 |
| 5,036,298 | A | * | 7/1991 | Bulzachelli | 331/23 |
| 5,079,520 | A | * | 1/1992 | Rapeli | 331/1 A |
| 5,391,996 | A | * | 2/1995 | Marz | 327/158 |
| 5,731,723 | A | * | 3/1998 | Chen | 327/157 |
| 6,043,717 | A | * | 3/2000 | Kurd | 331/17 |
| 6,125,157 | A | * | 9/2000 | Donnelly et al. | 375/371 |
| 6,356,122 | B2 | * | 3/2002 | Sevalia et al. | 327/105 |

* cited by examiner

Primary Examiner—Timothy P. Callahan
Assistant Examiner—An T. Luu

(57) ABSTRACT

A method for clock deskewing using a continuously calibrated delay element in a phase-locked loop is provided that includes receiving a feedback signal. A skew select signal is received. The feedback signal is delayed based on the skew select signal to generate a delay output signal. The delay output signal is provided to a phase detector. An external clock signal and the delay output signal are received at the phase detector. A phase detector signal is generated based on the external clock signal and the delay output signal. A skewed clock signal and the feedback signal are generated based on the phase detector signal.

18 Claims, 5 Drawing Sheets

METHOD AND SYSTEM FOR CLOCK DESKEWING USING A CONTINUOUSLY CALIBRATED DELAY ELEMENT IN A PHASE-LOCKED LOOP

This patent application is a continuation patent application of prior U.S. patent application Ser. No. 10/128,044 filed on Apr. 23, 2002, now abandoned.

TECHNICAL FIELD OF THE INVENTION

The present invention relates generally to integrated circuits and, more particularly, to a method and system for clock deskewing using a continuously calibrated delay element in a phase-locked loop.

BACKGROUND OF THE INVENTION

In many applications using integrated circuits, an external clock signal has to be interfaced with an application in the integrated circuit. In order to ensure that the internal clock signal used by the integrated circuit application is in phase with the external clock signal, delay-locked loops or phase-locked loops are often implemented as an interface between the two signals. For example, by feeding back the internal clock signal to a phase detector in a phase-locked loop and by providing the external clock signal to the phase detector, the phase-locked loop can acquire phase lock by forcing the difference between the two clock signals to be approximately zero.

However, for certain integrated circuit applications, the internal clock signal desired may be one that is different from the external clock signal. For example, the desired internal clock signal may be one that is delayed with respect to the external clock signal, or the desired internal clock signal may be one that leads the external clock signal. In these situations, the external clock signal and the internal clock signal may not be interfaced using a conventional phase-locked loop.

SUMMARY OF THE INVENTION

In accordance with the present invention, a method and system for clock deskewing using a continuously calibrated delay element in a phase-locked loop are provided that substantially eliminate or reduce disadvantages and problems associated with conventional systems and methods. In particular, a skewed output clock signal that leads or follows an external clock signal is generated by the phase-locked loop, which includes a delay element that delays either the skewed output clock signal or the external clock signal before providing the delayed signal to a phase detector in the phase-locked loop. The length of the delay is based on a skew select signal that is programmable by a user such that the skew may be adjusted based on the delay desired for a particular application.

According to one embodiment of the present invention, a method for clock deskewing using a continuously calibrated delay element in a phase-locked loop is provided that includes receiving a feedback signal. A skew select signal is received. The feedback signal is delayed based on the skew select signal to generate a delay output signal. The delay output signal is provided to a phase detector. An external clock signal and the delay output signal are received at the phase detector. A phase detector signal is generated based on the external clock signal and the delay output signal. A skewed clock signal and the feedback signal are generated based on the phase detector signal.

According to another embodiment of the present invention, a system for clock deskewing using a continuously calibrated delay element in a phase-locked loop is provided that includes a delay element, a phase detector, a voltage-controlled oscillator and a distribution network. The delay element is operable to receive a feedback signal and a skew select signal and to delay the feedback signal based on the skew select signal to generate a delay output signal. The phase detector is coupled to the delay element. The phase detector is operable to receive an external clock signal and the delay output signal and to generate a phase detector signal based on the external clock signal and the delay output signal. The voltage-controlled oscillator is coupled to the phase detector. The voltage-controlled oscillator is operable to receive the phase detector signal and to generate an output clock signal based on the phase detector signal. The distribution network is coupled to the voltage-controlled oscillator. The distribution network is operable to receive the output clock signal and to generate a skewed clock signal and the feedback signal based on the output clock signal.

According to another embodiment of the present invention, a phase-locked loop is provided that includes a delay element, a phase detector and a voltage-controlled oscillator. The delay element is operable to receive a feedback signal and a skew select signal and to delay the feedback signal based on the skew select signal to generate a delay output signal. The phase detector is coupled to the delay element. The phase detector is operable to receive an external clock signal and the delay output signal and to generate a phase detector signal based on the external clock signal and the delay output signal. The voltage-controlled oscillator is coupled to the phase detector. The voltage-controlled oscillator is operable to receive the phase detector signal and to generate an output clock signal based on the phase detector signal.

According to yet another embodiment of the present invention, a method for clock deskewing using a continuously calibrated delay element in a phase-locked loop is provided that includes receiving an external clock signal. A skew select signal is received. The external clock signal is delayed based on the skew select signal to generate a delay output signal. The delay output signal is provided to a phase detector. A feedback signal and the delay output signal are received at the phase detector. A phase detector signal is generated based on the feedback signal and the delay output signal. A skewed clock signal and the feedback signal are generated based on the phase detector signal.

Technical advantages of one or more embodiments of the present invention include providing an improved method for clock deskewing. In a particular embodiment, a phase-locked loop includes a delay element that delays either a skewed output clock signal or an external clock signal before providing the delayed signal to a phase detector in the phase-locked loop. The length of the delay is based on a skew select signal. The phase-locked loop acquires phase lock such that the phase difference between either the external clock signal and the delayed output clock signal or the delayed external clock signal and the output clock signal is approximately zero. As a result, a skewed output clock signal may be generated for internal use on an integrated circuit based on an external clock signal, with the skewed output clock signal leading or following the external clock signal by an amount equal to the propagation delay through the delay element. Accordingly, the amount of skew is programmable through the use of the skew select signal such that a user may adjust the skew based on the delay desired for a particular application.

Technical advantages of one or more embodiments of the present invention also include providing a phase-locked loop operable to generate a skewed output clock signal using a continuously calibrated delay element with minimal analog bias support circuitry, relatively small area and power requirements, and reduced sensitivity to process variation.

Other technical advantages will be readily apparent to one skilled in the art from the following figures, description, and claims.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged integrated circuit.

Figure 1:
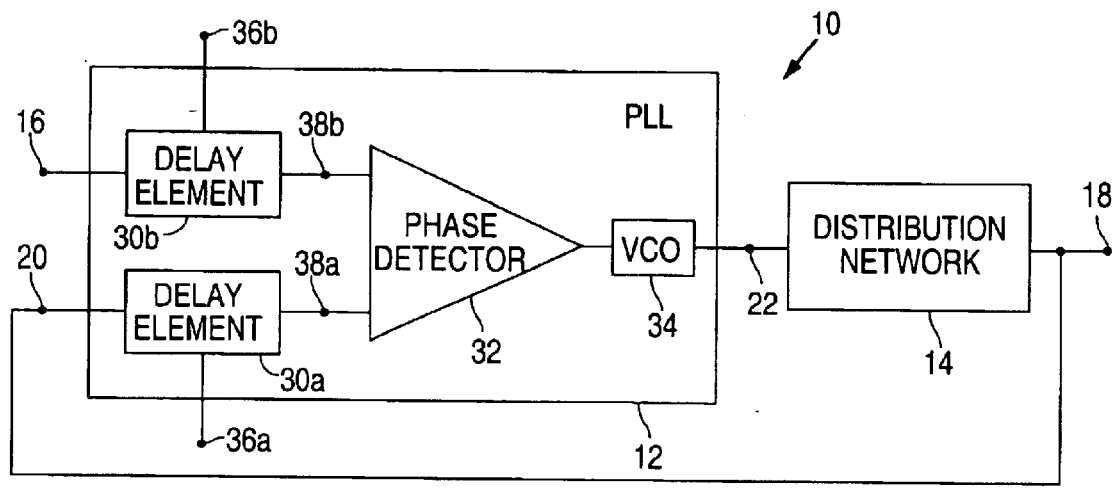
FIG. 1 is a block diagram illustrating a system for clock deskewing in accordance with one embodiment of the present invention.

FIG. 1 is a block diagram illustrating a system 10 for clock deskewing in accordance with one embodiment of the present invention. The system 10 comprises a phase-locked loop (PLL) 12 and a distribution network 14. The phase-locked loop 12 and the distribution network 14 are operable to receive an external clock signal 16 and to generate a programmable, phase-skewed clock signal 18 based on the external clock signal 16 for use in an integrated circuit. According to one embodiment, the external clock signal 16 comprises a 33 MHz to 133 MHz signal; however, it will be understood that the external clock signal 16 may comprise any suitable clock signal without departing from the scope of the present invention.

According to one embodiment, the system 10 comprises a PCI bus interface; however, it will be understood that the system 10 may comprise any suitable interface operable to receive a clock signal from an external system and to generate a phase-skewed version of the clock signal for internal use in an on-chip system without departing from the scope of the present invention.

The phase-locked loop 12 is operable to receive the external clock signal 16 and a feedback signal 20 and to generate an output clock signal 22 based on those signals 16 and 20 for the distribution network 14, which is coupled to the phase-locked loop 12.

The distribution network 14 is operable to receive the output clock signal 22 and to generate the skewed clock signal 18 and the feedback signal 20 based on the output clock signal 22. According to one embodiment, the distribution network 14 comprises a plurality of clock buffer gates.

The phase-locked loop 12 comprises at least one delay element 30, a phase detector 32, and a voltage-controlled oscillator (VCO) 34. The phase-locked loop 12 may comprise the delay element 30a, the delay element 30b or both delay elements 30a and 30b.

The delay element 30a is operable to receive the feedback signal 20 and a skew select signal 36a and to generate a delay output signal 38a based on those signals 20 and 36a. The delay output signal 38a comprises the feedback signal 20 delayed by an amount of time based on the skew select signal 36a. The skew select signal 36a comprises one of a plurality of possible signals based on the desired skew for the skewed clock signal 18. Thus, based on different skew select signals 36a, the skewed clock signal 18 may be programmed to lead the external clock signal 16 by different amounts.

The delay element 30b is operable to receive the external clock signal 16 and a skew select signal 36b and to generate a delay output signal 38b based on those signals 16 and 36b. The delay output signal 38b comprises the external clock signal 16 delayed by an amount of time based on the skew select signal 36b. The skew select signal 36b comprises one of a plurality of possible signals based on the desired skew for the skewed clock signal 18. Thus, based on different skew select signals 36b, the skewed clock signal 18 may be programmed to follow the external clock signal 16 by different amounts.

The phase detector 32 is coupled to one or both delay elements 30 and, based on which embodiment is implemented for the phase-locked loop 12, is operable to receive the external clock signal 16 and the delay output signal 38*a*, the feedback signal 20 and the delay output signal 38*b*, or the delay output signals 38*a* and 38*b*. The phase detector 32 is also operable to generate a phase detector signal for the voltage-controlled oscillator 34 based on the difference between the phases of the signals 16 and 38*a*, 20 and 38*b*, or 38*a* and 38*b*.

The phase-locked loop 12 is also operable to acquire phase lock such that the phase difference between the inputs to the phase detector 32 is approximately zero. Thus, the skewed clock signal 18, which is also provided as the feedback signal 20, may lead or follow the external clock signal 16 by an amount of time corresponding to the delay through one of the delay elements 30 once the phase-locked loop 12 has acquired phase lock.

The voltage-controlled oscillator 34 is coupled to the phase detector 32 and is operable to receive the phase detector signal from the phase detector 32 and to generate the output clock signal 22 based on the phase detector signal.

Figure 2:
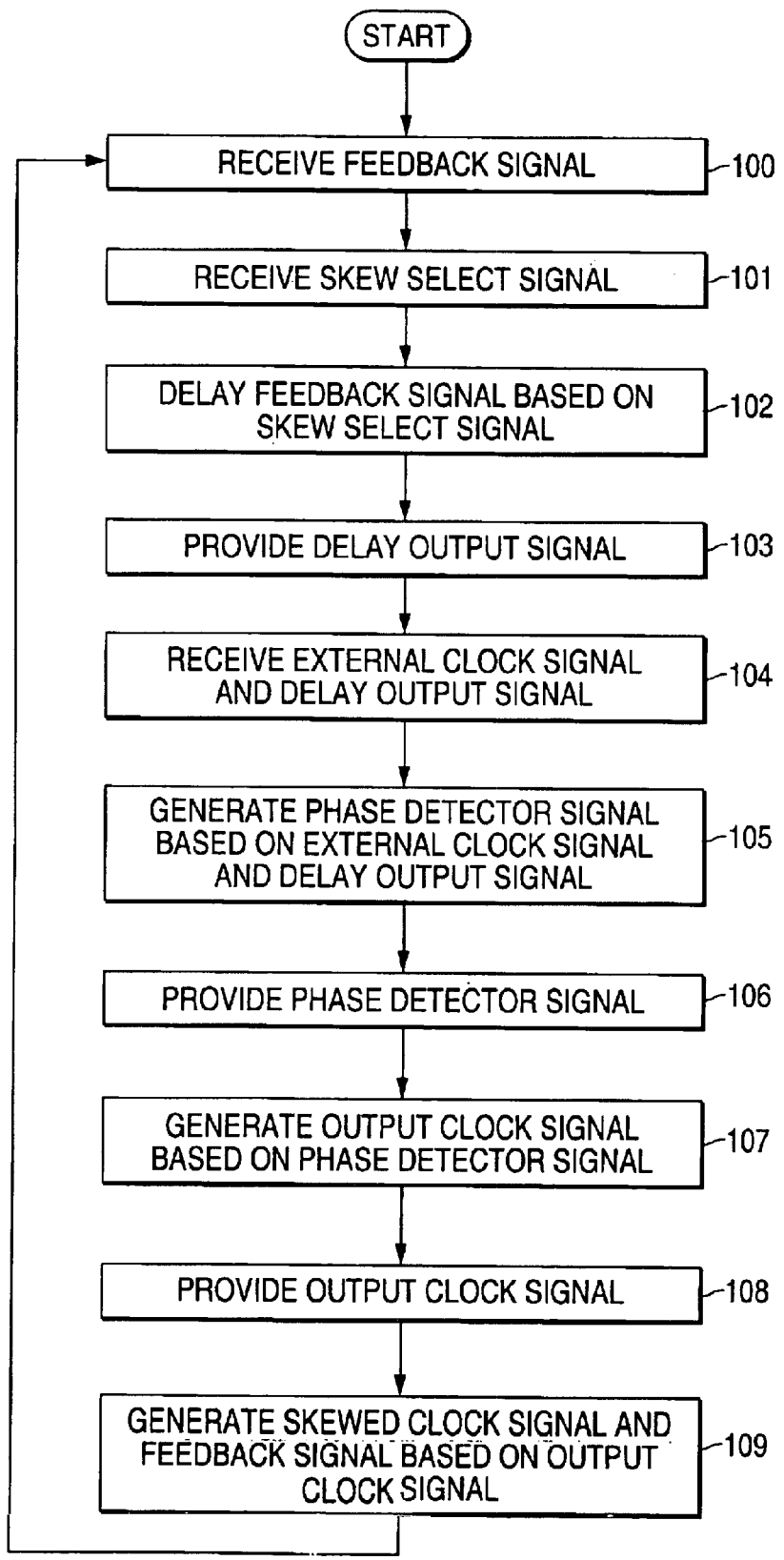
FIG. 2 is a flow diagram illustrating a method for clock deskewing using the system of FIG. 1 in accordance with one embodiment of the present invention.

FIG. 2 is a flow diagram illustrating a method for clock deskewing using the system 10 in accordance with one embodiment of the present invention. According to this embodiment, the phase-locked loop 12 either comprises the delay element 30*a* or comprises both delay elements 30*a* and 30*b* but, based on the skew select signals 36*a* and 36*b*, the delay element 30*a* is delaying the feedback signal 20 while the delay element 30*b* is not delaying the external clock signal 16.

The method begins at step 100 where the delay element 30*a* receives the feedback signal 20 from the distribution network 14. At step 101, the delay element 30*a* receives the skew select signal 36*a*. At step 102, the delay element 30*a* delays the feedback signal 20 based on the skew select signal 36*a*. At step 103, the delay element 30*a* provides the delay output signal 38*a*, which is the delayed feedback signal 20, to the phase detector 32.

At step 104, the phase detector 32 receives the external clock signal 16 and the delay output signal 38*a*. At step 105, the phase detector 32 generates the phase detector signal based on the difference between the external clock signal 16 and the delay output signal 38*a*.

At step 106, the phase detector 32 provides the phase detector signal to the voltage-controlled oscillator 34. At step 107, the voltage-controlled oscillator 34 generates the output clock signal 22 based on the phase detector signal. Thus, the phase-locked loop 12 generates the output clock signal 22 based on the external clock signal 16, the feedback signal 20, and the skew select signal 36*a*.

At step 108, the voltage-controlled oscillator 34 provides the output clock signal 22 to the distribution network 14. At step 109, the distribution network 14 generates the skewed clock signal 18 and the feedback signal 20 based on the output clock signal 22, after which the method returns to step 100 such that the skewed clock signal 18 is continuously calibrated based on the feedback signal 20. As used herein, "continuously" means on an on-going basis without substantial interruption.

In this way, a skewed clock signal 18 may be generated for internal use on an integrated circuit based on an external clock signal 16, with the skewed clock signal 18 leading the external clock signal 16 by an amount equal to the propagation delay through the delay element 30*a*. Thus, the amount of skew is programmable through the use of the skew select signal 36*a*.

Figure 3:
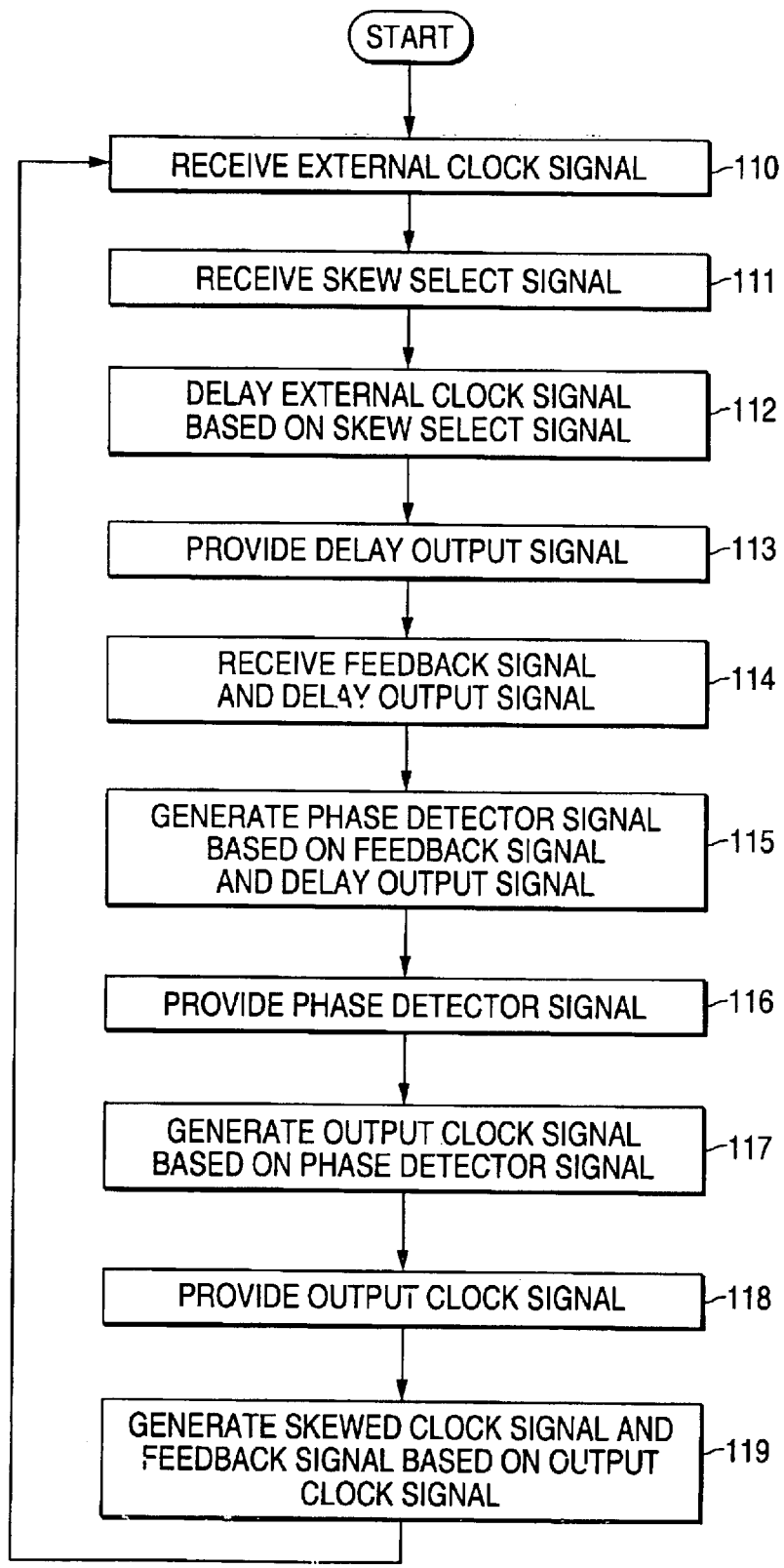
FIG. 3 is a flow diagram illustrating a method for clock deskewing using the system of FIG. 1 in accordance with another embodiment of the present invention.

FIG. 3 is a flow diagram illustrating a method for clock deskewing using the system 10 in accordance with another embodiment of the present invention. According to this embodiment, the phase-locked loop 12 either comprises the delay element 30*b* or comprises both delay elements 30*a* and 30*b* but, based on the skew select signals 36*a* and 36*b*, the delay element 30*b* is delaying the external clock signal 16 while the delay element 30*a* is not delaying the feedback signal 20.

The method begins at step 110 where the delay element 30*b* receives the external clock signal 16. At step 111, the delay element 30*b* receives the skew select signal 36*b*. At step 112, the delay element 30*b* delays the external clock signal 16 based on the skew select signal 36*b*. At step 113, the delay element 30*b* provides the delay output signal 38*b*, which is the delayed external clock signal 16, to the phase detector 32.

At step 114, the phase detector 32 receives the feedback signal 20 from the distribution network 14 and the delay output signal 38*b*. At step 115, the phase detector 32 generates the phase detector signal based on the difference between the feedback signal 20 and the delay output signal 38*b*.

At step 116, the phase detector 32 provides the phase detector signal to the voltage-controlled oscillator 34. At step 117, the voltage-controlled oscillator 34 generates the output clock signal 22 based on the phase detector signal. Thus, the phase-locked loop 12 generates the output clock signal 22 based on the external clock signal 16, the feedback signal 20, and the skew select signal 36*b*.

At step 118, the voltage-controlled oscillator 34 provides the output clock signal 22 to the distribution network 14. At step 119, the distribution network 14 generates the skewed clock signal 18 and the feedback signal 20 based on the output clock signal 22, after which the method returns to step 110 such that the skewed clock signal 18 is continuously calibrated based on the external clock signal 16.

In this way, a skewed clock signal 18 may be generated for internal use on an integrated circuit based on an external clock signal 16, with the skewed clock signal 18 following the external clock signal 16 by an amount equal to the propagation delay through the delay element 30*b*. Thus, the amount of skew is programmable through the use of the skew select signal 36*b*.

Figure 4:
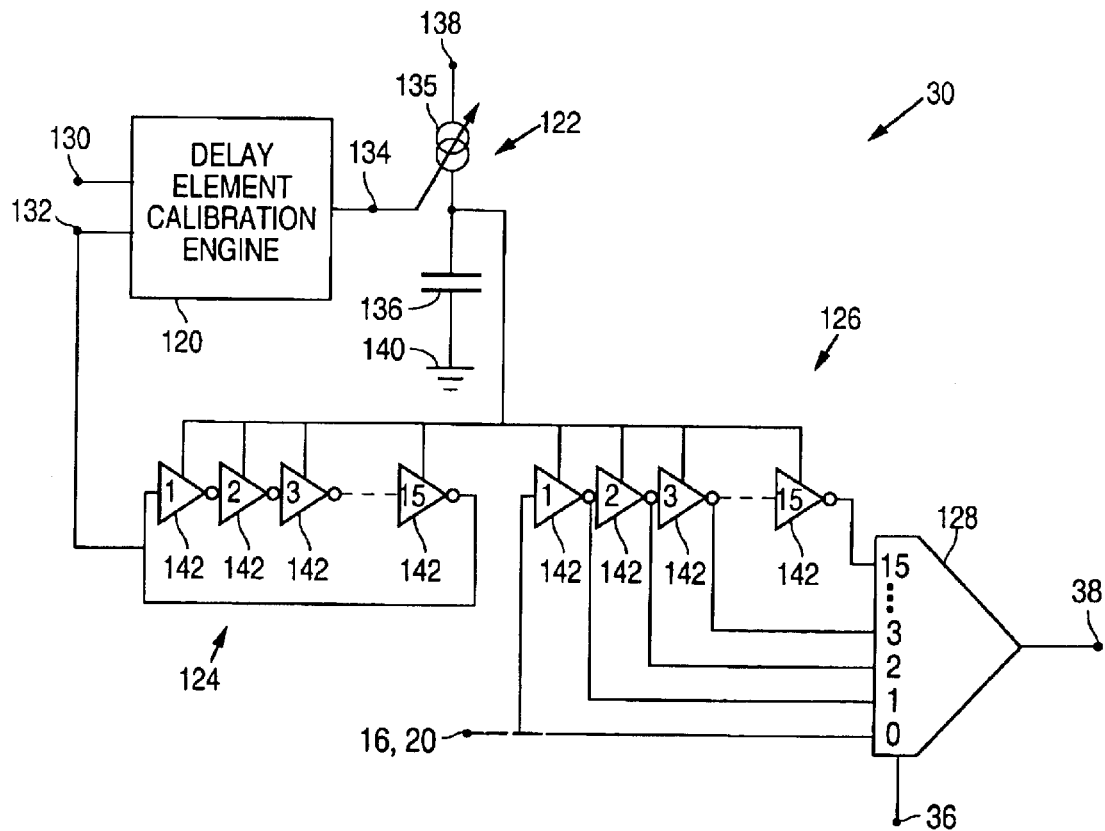
FIG. 4 is a circuit diagram illustrating the delay element of FIG. 1 in accordance with one embodiment of the present invention.

FIG. 4 is a circuit diagram illustrating the delay element 30 in accordance with one embodiment of the present invention. According to this embodiment, the delay element 30 comprises a delay element calibration engine 120, an 8-bit current digital-to-analog converter (DAC) 122, a 15-stage current-controlled oscillator 124, a 15-stage delay line 126 comprising sixteen taps, and a 16:1 multiplexer 128.

The delay element calibration engine 120 is operable to receive a reference clock signal 130 and an oscillator input signal 132 from the 15-stage current-controlled oscillator 124. According to one embodiment, the reference clock signal 130 comprises a 25 MHz signal; however, it will be understood that the reference clock signal 130 may comprise any suitable clock signal without departing from the scope of the present invention. The delay element calibration engine 120 is also operable to generate a DAC signal 134 for the DAC 122 based on the reference clock signal 130 and the oscillator input signal 132.

The DAC 122 comprises a current source 135 and a capacitor 136. The current source 135 is coupled to a power supply 138 and to the capacitor 136. The capacitor 136 is coupled to ground 140. The DAC 122 is operable to source current to the 15-stage current-controlled oscillator 124 and to the 15-stage delay line 126 based on the DAC signal 134 received from the delay element calibration engine 120.

The 15-stage current-controlled oscillator 124 comprises fifteen inverters 142, or other suitable gates, operable to oscillate based on a 30-gate delay, with fifteen gate delays high followed by fifteen gate delays low for each period. It will be understood that the current-controlled oscillator 124 may comprise any suitable number of stages without departing from the scope of the present invention. The oscillator 124 is operable to generate the oscillator input signal 132 for the delay element calibration engine 120.

The 15-stage delay line 126 comprises the same components as the 15-stage current-controlled oscillator 124. Thus, as with the current-controlled oscillator 124, it will be understood that the delay line 126 may comprise any suitable number of stages without departing from the scope of the present invention. For the illustrated embodiment, the delay line 126 comprises fifteen inverters 142, each of which comprises a tap to the multiplexer 128. As used herein, "each" means every one of at least a subset of the identified items. The input to the first inverter 142 is coupled to the 0 input of the multiplexer 128, which is also coupled either to the feedback signal 20 for the delay element 30a or to the external clock signal 16 for the delay element 30b. The output, or delay output signal 38, of the multiplexer 128 is operable to be selected by the skew select signal 36. For this embodiment, the skew select signal 36 comprises a four-bit value operable to identify one of the sixteen inputs to the multiplexer 128 from the inverters 142 of the delay line 126.

In operation, the delay element calibration engine 120 generates the DAC signal 134 based on the reference clock signal 130 and the oscillator input signal 132. The DAC 122 then provides a power supply to the current-controlled oscillator 124 and the delay line 126.

According to one embodiment, the reference clock signal 130 comprises a 25 MHz signal and the current-controlled oscillator 124 operates at 150 MHz. The delay element calibration engine 120 accumulates pulses from the current-controlled oscillator 124 for 25 periods of the reference clock signal 130. Based on the count of accumulated pulses, the delay element calibration engine 120 increments the DAC signal 134, decrements the DAC signal 134, or continues to generate the DAC signal 134 at the same level.

If the count is too low, the current provided by the DAC 122 to the current-controlled oscillator 124, and thus to the delay line 126, is too low. In this case, the DAC signal 134 is incremented to cause the DAC 122 to increase the current. If the count is too high, the current provided by the DAC 122 to the current-controlled oscillator 124, and thus to the delay line 126, is too high. In this case, the DAC signal 134 is decremented to cause the DAC 122 to decrease the current.

The delay output signal 38 is provided by the multiplexer 128 based on a selection of one of the inputs from the inverters 142 of the delay line 126. This selection is determined based on the skew select signal 36, which is programmable in that a user may adjust this signal 36 based on the delay desired for the application in which the system 10 is to be used.

Thus, the current-controlled oscillator 124 is used as a mirror of the delay line 126 in order to track the timing through the gates, or inverters 142, of the delay line 126. This oscillator 124 then allows the delay element calibration engine 120 to provide the appropriate signal 134 to the DAC 122 in order to ensure that the delay line 126 is receiving the appropriate current level from the DAC 122 to give the desired delay output signal 38 from the delay line 126 to the phase detector 32.

Figure 5:
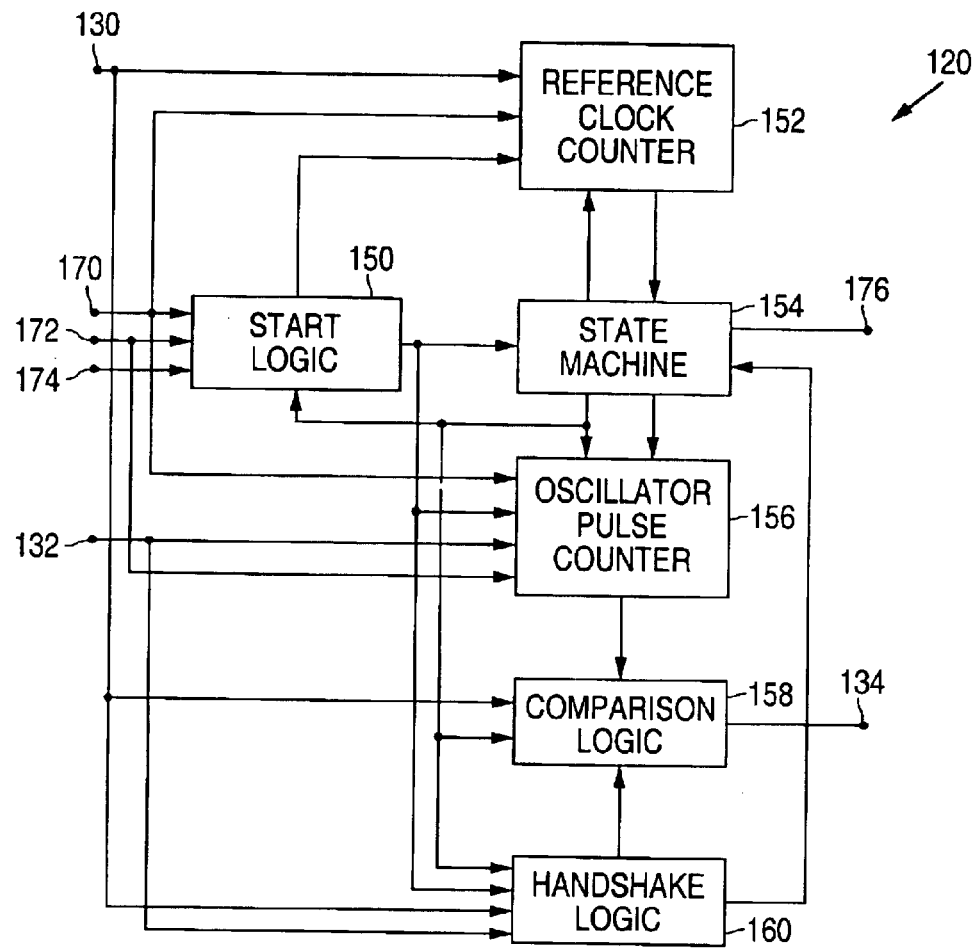
FIG. 5 is a block diagram illustrating the delay element calibration engine of FIG. 4 in accordance with one embodiment of the present invention.

FIG. 5 is a block diagram illustrating the delay element calibration engine 120 in accordance with one embodiment of the present invention. The delay element calibration engine 120 is operable to calibrate the delay element 30. The delay element calibration engine 120 comprises start logic 150, a reference clock counter 152, a state machine 154, an oscillator pulse counter 156, comparison logic 158, and handshake logic 160.

The delay element calibration engine 120 is operable to receive the reference clock signal 130 from an external source and the oscillator input signal 132 from the 15-stage current-controlled oscillator 124 of the delay element 30. The delay element calibration engine 120 is also operable to generate the DAC signal 134 for the DAC 122 of the delay element 30. In addition, the delay element calibration engine 120 is operable to receive a reset signal 170, an enable signal 172, and a manual calibrate signal 174 and to generate an error/state signal 176 that is operable to allow register status of the most recent calibration.

The state machine 154 controls the calibration process. According to one embodiment, the state machine 154 comprises three states: Idle, Count and Compare. In operation, according to one embodiment, the state machine 154 is placed in the Idle state and is reset when the reset signal 170 is active.

When the reset process is complete, the start logic 150 signals the state machine 154 to move into the Count state in order to begin the calibration process. The start logic 150 also signals the reference clock counter 152 to begin counting clock cycles of the reference clock signal 130.

While in the Count state, the state machine 154 waits for the reference clock counter 152 to count 25 clock cycles of the reference clock signal 130, while allowing the oscillator pulse counter 156 to count the pulses of the oscillator input signal 132.

After this, the state machine 154 moves to the Compare state. While in the Compare state, the state machine 154 waits for the comparison logic 158 to determine whether or not to adjust the DAC signal 134. The comparison logic 158 latches and holds the pulse count provided by the oscillator pulse counter 156.

The comparison logic 158 then compares the pulse count to a specified value or range of values. According to one embodiment, the specified range of values is 148–152. If the pulse count is within this range of values, the DAC signal 134 is kept at the same level. However, if the pulse count is less than 148, the DAC signal 134 is incremented, and if the pulse count is greater than 152, the DAC signal 134 is decremented.

After the comparison logic 158 determines whether or not to adjust the DAC signal 134 and the adjustment, if any, is made, the pulse count is reset to zero and the state machine 154 returns to the Count state to begin the process over again, thereby allowing the DAC signal 134 to be continuously calibrated. The handshake logic 160 allows adequate set-up time for the comparison logic 158 and allows the pulse count to be reset before the state machine 154 returns to the Count state.

Figure 6:
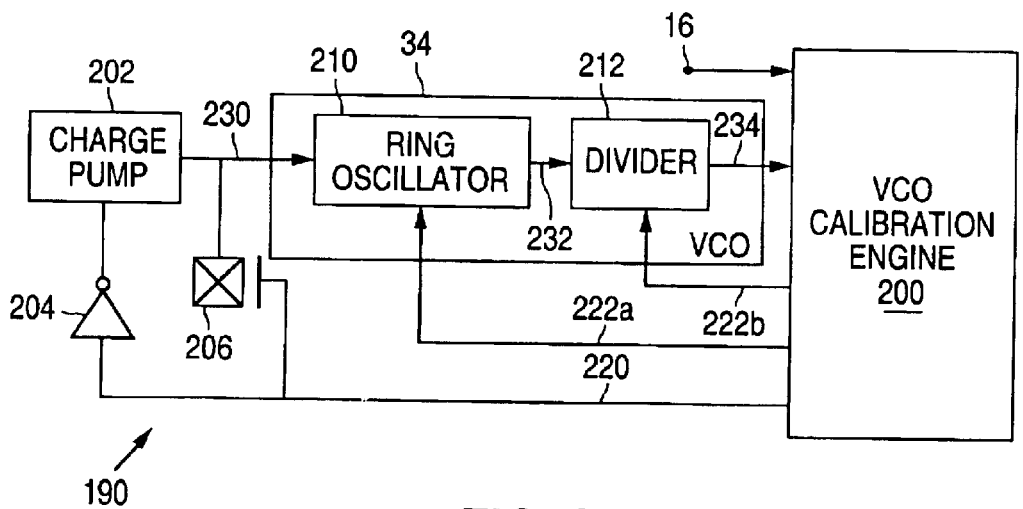
FIG. 6 is a block diagram illustrating a calibration system for the voltage-controlled oscillator of FIG. 1 in accordance with one embodiment of the present invention.

FIG. 6 is a block diagram illustrating a calibration system 190 for the voltage-controlled oscillator 34 in accordance with one embodiment of the present invention. The calibration system 190 comprises a voltage-controlled oscillator (VCO) calibration engine 200, a charge pump 202, an inverter 204, and an analog transmission gate 206, in addition to the voltage-controlled oscillator 34.

The VCO calibration engine 200 is operable to control the calibration process for the voltage-controlled oscillator 34.

The charge pump 202 is operable to force packets of charge into the loop filter. The analog transmission gate 206 is operable to force the tuning voltage of the ring oscillator 210 to be approximately half of the supply voltage, or $V_{DD}/2$.

The voltage-controlled oscillator 34 comprises a ring oscillator 210 and a post-scale divider 212. The VCO calibration engine 200 is operable to generate a calibrate signal 220 and a range signal 222. According to the illustrated embodiment, the VCO calibration engine 200 is operable to provide the range signal 222 as a first range signal 222a to the ring oscillator 210 and a second range signal 222b to the post-scale divider 212.

The first range signal 222a may comprise two bits, and the second range signal 222b may comprise two bits. The first range signal 222a may be operable to provide coarse current ranging control for the ring oscillator 210. The post-scale divider 212 may be operable to divide the signal from the ring oscillator 210 by one of four values based on the second range signal 222b. According to one embodiment, the post-scale divider 212 is operable to divide the signal from the ring oscillator 210 by 1, 2, 4 or 8.

Based on the calibrate signal 220, the charge pump 202, in conjunction with the inverter 204 and the transmission gate 206, is operable to generate a charge signal 230 for the ring oscillator 210. The ring oscillator 210 is operable to generate a ring oscillation signal 232 based on the charge signal 230, and the post-scale divider 212 is operable to divide the ring oscillation signal 232 by a value determined by the second range signal 222b in order to generate a VCO output signal 234 for the VCO calibration engine 200. The VCO calibration engine 200 is also operable to receive the external clock signal 16.

In operation, in order to calibrate the voltage-controlled oscillator 34, the VCO calibration engine 200 asserts the calibrate signal 220, which tri-states the charge pump 202 through the inverter 204, thereby avoiding contention on the loop filter node. The calibrate signal 220 also causes the loop filter node to be driven by approximately $V_{DD}/2$.

Initially, the bias current for the voltage-controlled oscillator 34 is set to a relatively low value and the post-scale divider 212 is set by the range signal 222b to divide the ring oscillator signal 232 by 8. The VCO output signal 234 is allowed to stabilize for 512 clock cycles of the external clock signal 16.

The VCO calibration engine 200 then waits for another 512 clock cycles of the external clock signal 16, while counting the pulses of the VCO output signal 234. After this, the VCO calibration engine 200 compares the pulse count to a specified value or range of values. According to one embodiment, the specified value is 512. If the pulse count is less than the specified value, the range signal 222 is incremented and the VCO calibration engine 200 begins counting the pulses of the VCO output signal 234 again.

However, if the pulse count is equal to or greater than this specified value, the range signal 222 is kept at the same level and the calibrate signal 220 is deasserted. The phase-locked loop 12 may then acquire phase lock. The calibration system 190 converges to the solution with the ring oscillator 210 running at the highest frequency possible, thereby improving jitter performance because the transistors in the ring oscillator 210 are operated at a higher overdrive condition.

Figure 7:
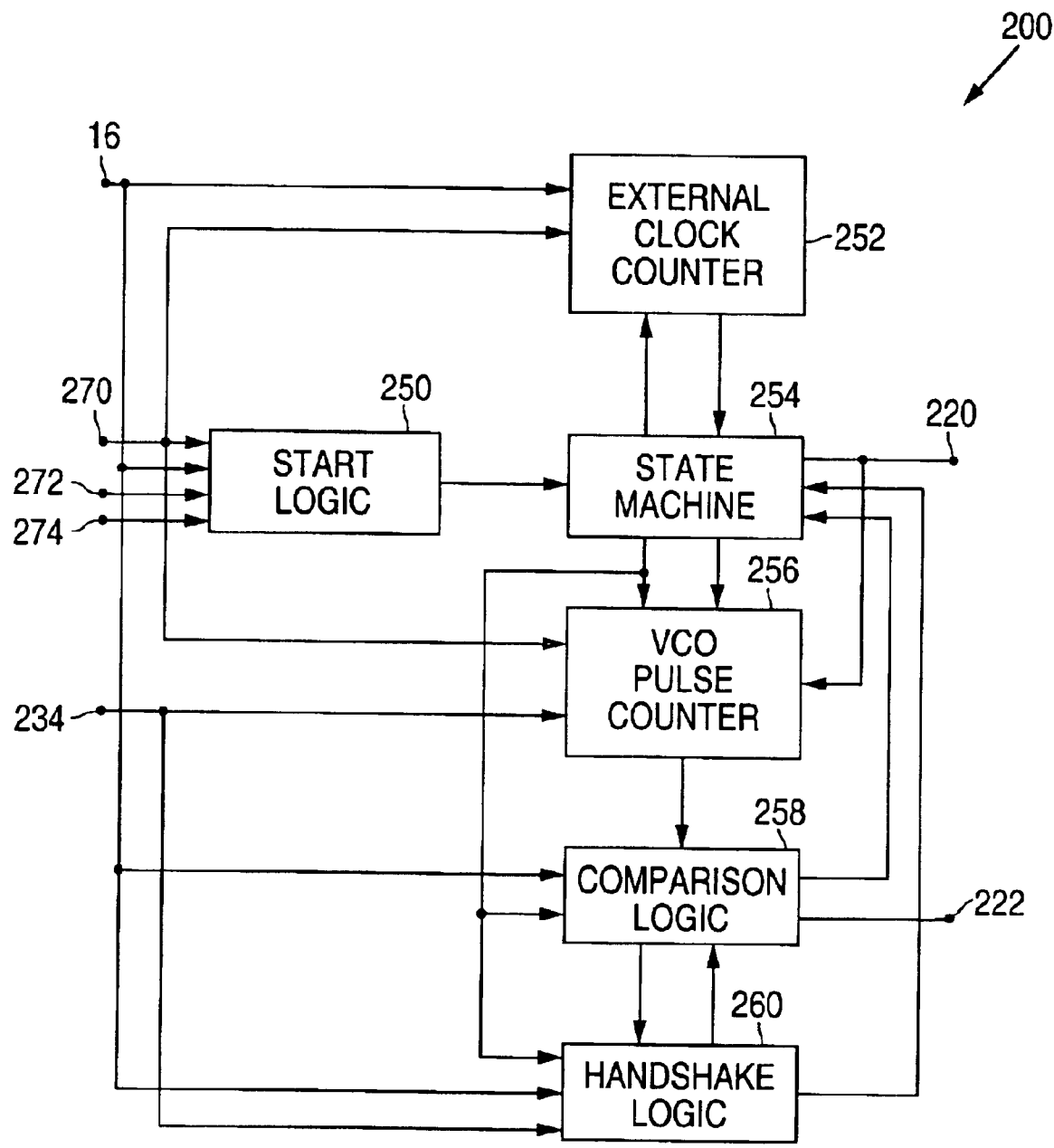
FIG. 7 is a block diagram illustrating the voltage-controlled oscillator calibration engine of FIG. 6 in accordance with one embodiment of the present invention.

FIG. 7 is a block diagram illustrating the voltage-controlled controlled oscillator (VCO) calibration engine 200 in accordance with one embodiment of the present invention. The VCO calibration engine 200 is operable to calibrate the voltage-controlled oscillator 34. The VCO calibration engine 200 comprises start logic 250, an external clock counter 252, a state machine 254, a VCO pulse counter 256, comparison logic 258, and handshake logic 260.

The VCO calibration engine 200 is operable to receive the external clock signal 16 from an external source and the VCO output signal 234 from the voltage-controlled oscillator 34. The VCO calibration engine 200 is also operable to generate the calibrate signal 220 for the inverter 204 and transmission gate 206 of the calibration system 190 and the range signal 222 for the voltage-controlled oscillator 34. In addition, the VCO calibration engine 200 is operable to receive a reset signal 270, an enable signal 272, and a manual calibrate signal 274. In addition, the VCO calibration engine 200 is operable to generate along with the calibrate signal 220 a complete/error/state signal. The complete/error portion of the signal is operable to allow register status of the most recent calibration.

The state machine 254 controls the calibration process. According to one embodiment, the state machine 254 comprises six states: Idle, Stabilize, Count, Compare, Done and Error. In operation, according to one embodiment, the state machine 254 is placed in the Idle state and is reset when the reset signal 270 is active. When the reset process is complete, the start logic 250 signals the state machine 254 to move into the Stabilize state in order to begin the calibration process.

While in the Stabilize state, the state machine 254 waits for the external clock counter 252 to count 512 clock cycles of the external clock signal 16 to allow the VCO output signal 234 to stabilize. The state machine 254 then moves to the Count state and waits for the external clock counter 252 to count another 512 clock cycles of the external clock signal 16, while allowing the VCO pulse counter 256 to count the pulses of the VCO output signal 234.

After this, the state machine 254 moves to the Compare state. While in the Compare state, the state machine 254 waits for the comparison logic 258 to determine whether or not to adjust the range signal 222. The comparison logic 258 latches and holds the pulse count provided by the VCO pulse counter 256.

The comparison logic 258 then compares the pulse count to a specified value or range of values. According to one embodiment, the specified value is 512. If the pulse count is equal to or greater than this specified value, the state machine 254 moves to the Done state, where the range signal 222 is kept at the same level and the calibrate signal 220 is deasserted. However, if the pulse count is less than the specified value, the range signal 222 is incremented and the state machine 254 moves back into the Count state to begin that process again. The handshake logic 260 allows adequate set-up time for the comparison logic 258 and allows the pulse count to be reset before the state machine 254 returns to the Count state.

If the range signal 222 has been incremented to its highest value and the pulse count remains less than the specified value, the state machine 254 moves to the Error state, where the calibration process comes to an end by deasserting the calibrate signal 220 and asserting the error signal.

Although the present invention has been described with several embodiments, various changes and modifications may be suggested to one skilled in the art. It is intended that the present invention encompass such changes and modifications as fall within the scope of the appended claims.

What is claimed is:

1. A method for clock deskewing using a continuously calibrated delay element in a phase-locked loop, comprising:

receiving a feedback signal;
receiving a skew select signal;
receiving a digital-to-analog converter signal and adjusting an amount of current generated based on the digital-to-analog converter signal;
delaying the feedback signal based on the skew select signal and using the generated current to generate a delay output signal;
providing the delay output signal to a phase detector;
receiving an external clock signal and the delay output signal at the phase detector;
generating a phase detector signal based on the external clock signal and the delay output signal; and
generating a skewed clock signal and the feedback signal based on the phase detector signal.

2. The method of claim 1, further comprising:
providing the phase detector signal to a voltage-controlled oscillator; and
generating an output clock signal based on the phase detector signal.

3. The method of claim 2, further comprising:
providing the output clock signal to a distribution network; and
generating the skewed clock signal and the feedback signal comprising generating the skewed clock signal and the feedback signal based on the output clock signal.

4. The method of claim 1, the skew select signal comprising a first value, and further comprising receiving the skew select signal, the skew select signal comprising a second value.

5. The method of claim 4, the skew select signal comprising a first value, delaying the feedback signal based on the skew select signal to generate a delay output signal comprising delaying the feedback signal by a first amount of time corresponding to the first value, and further comprising receiving the skew select signal, the skew select signal comprising a second value, and delaying the feedback signal based on the skew select signal to generate a delay output signal comprising delaying the feedback signal by a second amount of time corresponding to the second value.

6. A system for clock deskewing using a continuously calibrated delay element in a phase-locked loop, comprising:
a delay element operable to receive a feedback signal and a skew select signal and to delay the feedback signal based on the skew select signal to generate a delay output signal;
a phase detector coupled to the delay element, the phase detector operable to receive an external clock signal and the delay output signal and to generate a phase detector signal based on the external clock signal and the delay output signal;
a voltage-controlled oscillator coupled to the phase detector, the voltage-controlled oscillator operable to receive the phase detector signal and to generate an output clock signal based on the phase detector signal; and
a distribution network coupled to the voltage-controlled oscillator, the distribution network operable to receive the output clock signal and to generate a skewed clock signal and the feedback signal based on the output clock signal;
the delay element comprising:
a delay element calibration engine operable to continuously calibrate the delay element; and
a digital-to-analog converter coupled to the delay element calibration engine, the digital-to-analog converter operable to receive a digital-to-analog converter signal from the delay element calibration engine and to adjust an amount of current generated based on the digital-to-analog converter signal.

7. The system of claim 6, the skew select signal comprising a first value, and the delay element further operable to receive the skew select signal, the skew select signal comprising a second value.

8. The system of claim 6, the skew select signal comprising a first value, the delay element further operable to delay the feedback signal based on the skew select signal to generate a delay output signal by delaying the feedback signal by a first amount of time corresponding to the first value, and the delay element further operable to receive the skew select signal, the skew select signal comprising a second value, and to delay the feedback signal based on the skew select signal to generate a delay output signal by delaying the feedback signal by a second amount of time corresponding to the second value.

9. The system of claim 6, the delay element further comprising a current-controlled oscillator coupled to the digital-to-analog converter and to the delay element calibration engine, the current-controlled oscillator operable to oscillate at a specified frequency and to provide pulses based on the current generated by the digital-to-analog converter to the delay element calibration engine.

10. The system of claim 9, the delay element further comprising a delay line coupled to the digital-to-analog converter and to the current-controlled oscillator, the delay line comprising components comparable to components of the current-controlled oscillator, the delay line operable to provide a plurality of output values.

11. The system of claim 10, the delay element further comprising a multiplexer coupled to the delay line, the multiplexer operable to receive the output values from the delay line and the skew select signal and to generate the delay output signal based on the skew select signal, the delay output signal comprising one of the output values from the delay line.

12. A method for clock deskewing using a continuously calibrated delay element in a phase-locked loop, comprising:
receiving an external clock signal;
receiving a skew select signal;
delaying the external clock signal based on the skew select signal to generate a delay output signal;
providing the delay output signal to a phase detector;
receiving a feedback signal and the delay output signal at the phase detector;
generating a phase detector signal based on the feedback signal and the delay output signal; and
generating a skewed clock signal and the feedback signal based on the phase detector signal.

13. The method of claim 12, further comprising:
providing the phase detector signal to a voltage-controlled oscillator; and
generating an output clock signal based on the phase detector signal.

14. The method of claim 13, further comprising:
providing the output clock signal to a distribution network; and
generating the skewed clock signal and the feedback signal comprising generating the skewed clock signal and the feedback signal based on the output clock signal.

15. A phase-locked loop, comprising:

a delay element operable to receive a feedback signal and a skew select signal and to delay the feedback signal based on the skew select signal to generate a delay output signal;

a phase detector coupled to the delay element, the phase detector operable to receive an external clock signal and the delay output signal and to generate a phase detector signal based on the external clock signal and the delay output signal; and a voltage-controlled oscillator coupled to the phase detector, the voltage-controlled oscillator operable to receive the phase detector signal and to generate an output clock signal based on the phase detector signal;

the delay element comprising a delay element calibration engine operable to continuously calibrate the delay element and a digital-to-analog converter coupled to the delay element calibration engine, the digital-to-analog converter operable to receive a digital-to-analog converter signal from the delay element calibration engine and to adjust an amount of current generated based on the digital-to-analog converter signal.

16. The system of claim 15, the delay element further comprising a current-controlled oscillator coupled to the digital-to-analog converter and to the delay element calibration engine, the current-controlled oscillator operable to oscillate at a specified frequency and to provide pulses based on the current generated by the digital-to-analog converter to the delay element calibration engine.

17. The system of claim 16, the delay element further comprising a delay line coupled to the digital-to-analog converter and to the current-controlled oscillator, the delay line comprising components comparable to components of the current-controlled ocillator, the delay line operable to provide a plurality of output values.

18. The system of claim 17, the delay element further comprising a multiplexer coupled to the delay line, the multiplexer operable to receive the output values from the delay line and the skew select signal and to generate the delay output signal based on the skew select signal, the delay output signal comprising one of the output values from the delay line.

* * * * *